(12) United States Patent
Belady et al.

(10) Patent No.: US 7,120,022 B2
(45) Date of Patent: Oct. 10, 2006

(54) LOOP THERMOSYPHON WITH WICKING STRUCTURE AND SEMICONDUCTOR DIE AS EVAPORATOR

(75) Inventors: Christian L. Belady, McKinney, TX (US); Roy Zeighami, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 226 days.

(21) Appl. No.: 10/808,111

(22) Filed: Mar. 24, 2004

(65) Prior Publication Data

US 2004/0179338 A1     Sep. 16, 2004

Related U.S. Application Data

(63) Continuation-in-part of application No. 10/074,885, filed on Feb. 12, 2002, now Pat. No. 6,704,200.

(51) Int. Cl.
  *H05K 7/20* (2006.01)

(52) U.S. Cl. ............... 361/701; 361/700; 361/704; 361/699; 165/80.3; 165/80.4; 165/104.33; 62/259.2

(58) Field of Classification Search ........ 361/687–704, 361/715, 722, 717–720, 749–751; 174/15.1, 174/15.2, 16.3, 252; 165/80.2, 80.3, 80.4, 165/185, 104.19, 104.21, 104.26, 104.32, 165/104.33, 104.34; 29/890.03; 62/259.2; 257/713–715, 721–727
See application file for complete search history.

(56) References Cited

U.S. PATENT DOCUMENTS 6,501,654 B1 * 12/2002 O'Connor et al. .......... 361/699
6,976,527 B1 * 12/2005 Kirshberg et al. ...... 165/104.33
2002/0179284 A1 * 12/2002 Joshi et al. ................ 165/80.3

* cited by examiner

*Primary Examiner*—Michael Datskovskiy

(57) ABSTRACT

A loop thermosyphon system has a semiconductor die with a plurality of microchannels. A condenser is in fluid communication with the microchannels. A wicking structure wicks fluid between the condenser to the semiconductor die.

28 Claims, 6 Drawing Sheets

LOOP THERMOSYPHON WITH WICKING STRUCTURE AND SEMICONDUCTOR DIE AS EVAPORATOR

RELATED APPLICATIONS

This application is a continuation-in-part of commonly-owned U.S. application Ser. No. 10/074,885, filed Feb. 12, 2002 now U.S. Pat. No. 6,704,200 and incorporated herein by reference.

BACKGROUND OF THE INVENTION

The complexity and cost associated with power dissipation in computing systems continues to grow with increasing demands on computing performance. These systems commonly employ numerous semiconductor packages that must be coupled to sufficient power dissipation capacity. Air cooling of the packages may not be sufficient in systems incorporating highly dense physical architectures; in such instances, liquid cooling of the packages may be required.

Certain prior art techniques couple fluid (e.g., water or alcohol) directly to the semiconductor package to address thermal dissipation requirements. However, these techniques provide only a fraction of the total required thermal dissipation because most of the thermal impedance is internal to the semiconductor package, thereby dominating how thermal dissipation occurs, irrespective of coupling fluid or thermal sinks attached to the package. Accordingly, a reduction of the package's internal thermal impedance is needed in order to make significant improvement to overall thermal dissipation.

The prior art has also attempted to incorporate microchannels within the semiconductor element (or "die") of the package, to improve cooling efficiency. Each microchannel is for example etched into the semiconductor substrate so as to provide increased cooling area to the substrate. In one example, these microchannels are formed as a series of "fins" in the substrate to assist in dissipating internally-generated heat. One difficulty with the prior art's use of microchannels is that high pressure is used to couple fluid to the die; a pressure pump forces the fluid to flow through the microchannels. This pressure pump has significant failure modes that make it risky to use within computing systems.

The prior art has also attempted to utilize "loop thermosyphon" techniques to cool the semiconductor package. Loop thermosyphon of the prior art utilizes an evaporator, such as a metal block, to thermally cool the semiconductor package by coupling cooling liquid therebetween. The package heats up to generate vapor from the liquid, and the density differences between the liquid and the vapor assists heat transfer between the evaporator and the semiconductor package. However, loop thermosyphon of the prior art also does not reduce internal thermal impedance of the semiconductor package and, therefore, it too does not dissipate enough thermally generated energy from the package.

SUMMARY OF THE INVENTION

In one embodiment, a loop thermosyphon system has a semiconductor die with a plurality of microchannels. A condenser is in fluid communication with the microchannels. A wicking structure wicks fluid between the condenser and the semiconductor die.

In another embodiment, a loop thermosyphon system has a semiconductor die with a plurality of microchannels. One or more of the microchannels is shaped for preferential fluid flow along one direction of the die. A condenser is in fluid communication with the microchannels, to cool heated fluid from the die for input to the microchannels.

In another embodiment, a loop thermosyphon system has a semiconductor die with a plurality of microchannels. At least one orifice is at an input to one of the microchannels, for preferential fluid flow along one direction of the one microchannel. A condenser is in fluid communication with the microchannels, to cool heated fluid from the die for input to the microchannels.

DETAILED DESCRIPTION OF THE DRAWINGS

Figure 1:
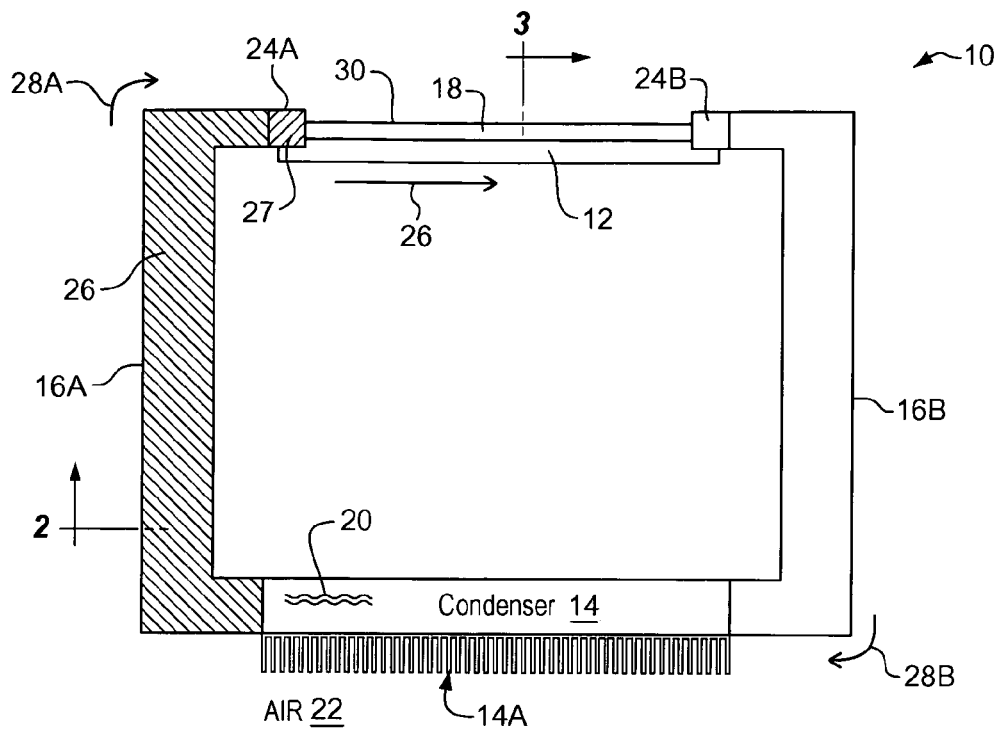
FIG. 1 shows a schematic view of one loop thermosyphon system with wicking structure and semiconductor die as evaporator.

FIG. 1 shows a schematic view of one loop thermosyphon system 10. System 10 has a semiconductor die 12 coupled to a condenser 14 via an input fluid conduit 16A and an output fluid conduit 16B. Die 12 has a plurality of microchannels 18 formed into its substrate, such as described and shown in connection with FIG. 3, FIG. 4, FIG. 5, FIG. 7 or FIG. 9. Condenser 14 is a heat-exchanger that cools fluid 20 within system 10, for example, by convection with air 22 adjacent to condenser 14. Condenser 14 may include a series of fins 14A, as shown, to enhance heat transfer to air 22.

Microchannels 18, condenser 14 and fluid conduits 16A, 16B form a closed-loop fluid pressure volume for fluid 20, which converts to vapor (or a vapor-fluid mix) when heated by semiconductor die 12 and then to liquid when cooled by condenser 14. For purposes of illustration, fluid 20 is only shown within condenser 14, though it should be apparent that fluid 20 extends throughout the closed-loop pressure volume as either fluid, vapor or fluid-vapor mix. Heated fluid, vapor or fluid-vapor mix from the die is sometimes referred to herein as "heated fluid."

System 10 may include an input header 24A, to couple input fluid conduit 16A to semiconductor die 12, and an output header 24B, to couple output fluid conduit 16B to semiconductor die 12.

Internal to input fluid conduit 16A is a wicking structure 26 (shown in more detail in FIG. 2) that provides capillary attraction to draw fluid flow from condenser 14, through input fluid conduit 16A and to input header 24A, along direction 28A. Interaction of fluid 20 with die 12 generates heated fluid (or vapor or vapor-fluid mix) that also drives fluid flow from condenser 14 through output conduit 16B, along direction 28B. In one example of operation, die 12 boils fluid 20 to create the fluid-vapor mix, which pressurizes fluid flow along direction 28B. This fluid-vapor mix enters condenser 14, from output fluid conduit 16B, and then cools within condenser 14 such that a liquid form of fluid 20 leaves condenser 14, to input fluid conduit 16A. A self-sustained circular flow of fluid 20 along directions 28A, 28B may thus be attained within system 10.

Upon reading and fully appreciating this disclosure, one skilled in the art appreciates that condenser 14 may take other forms without departing from the scope hereof. For example, though condenser 14 is shown to operate as a liquid-to-air heat exchanger, it may instead take the form of a heat sink, another semiconductor die, or other heat-exchanging device, for example.

Fluid 20 is for example water, Fluorinert or alcohol. Other liquids having suitable temperature and pressure phase change properties may be used.

Figure 2:
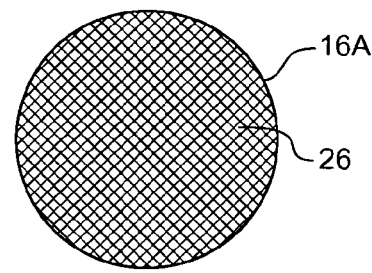
FIG. 2 shows a cross-sectional view of a fluid conduit with wicking structure.

FIG. 2 shows a cross-sectional view of input fluid conduit 16A, to further illustrate wicking structure 26. Wicking structure 26 is for example a conductive porous-like material—such as thermally-conductive fiber (e.g., copper fiber), thermally conductive powder (e.g., copper fiber), or thermally conductive screen (e.g., copper screen)—that induces capillary fluid forces that draws fluid 20 from condenser 14, through input fluid conduit 16A, to input header 24A. In one embodiment, input header 24A also incorporates a wicking structure 27, to further increase capillary fluid forces from condenser 14 to die 12. Wicking structure 27 may be the same or different from wicking structure 26. Other material or structure may be used as wicking structure 26 and/or 27 so long as it provides capillary action on fluid, including, for example, fibrous material (e.g., metal fiber), microgrooves (e.g., microgrooves within fluid conduit 16A and/or input header 24A), sintered material (sintered metals), porous or plastic foam, non-metal porous materials, and metal matrix.

Though the cross-sectional shape of input fluid conduit 16A is shown in FIG. 2 as circular, it should be clear that it may be alternatively be rectangular or another shape without departing from the scope hereof.

Figure 3:
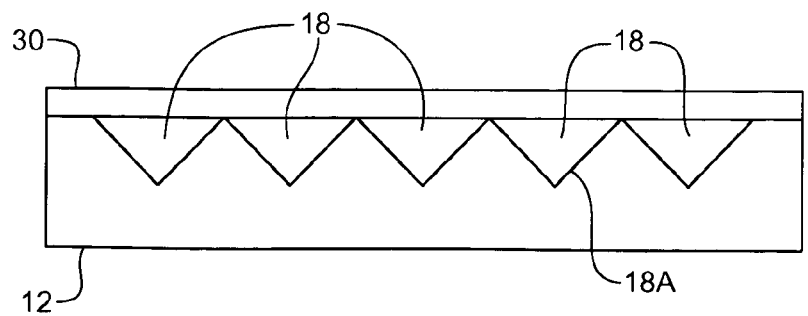
FIG. 3 illustrates a side-view of one die with a plurality of microchannels.

FIG. 3 shows a cross-sectional side view (not to scale) of die 12 with microchannels 18 etched therein (as shown by etch line 18A). A silicon plate 30 (e.g., glass) may be used to seal microchannels 18 so as to form fluid conduits for fluid 20 (plate 30 is also shown in FIG. 1 for purpose of illustration).

With further regard to FIG. 1, system 10 may be "pre-charged" by filling the closed-loop volume of microchannels 18, condenser 14 and fluid conduits 16A, 16B with fluid to at least about 50%, to ensure that die 12 (as the system "evaporator") is initially "wet" prior to operation. Moreover, condenser 14 may be positioned above die 12 so that vapor generated from interaction of fluid 20 with die 12 moves upwards, though input fluid conduit 16A to condenser 14, and so that gravity assists the flow of cooled liquid 20 downward, through output fluid conduit 16B to die 12.

Figure 4:
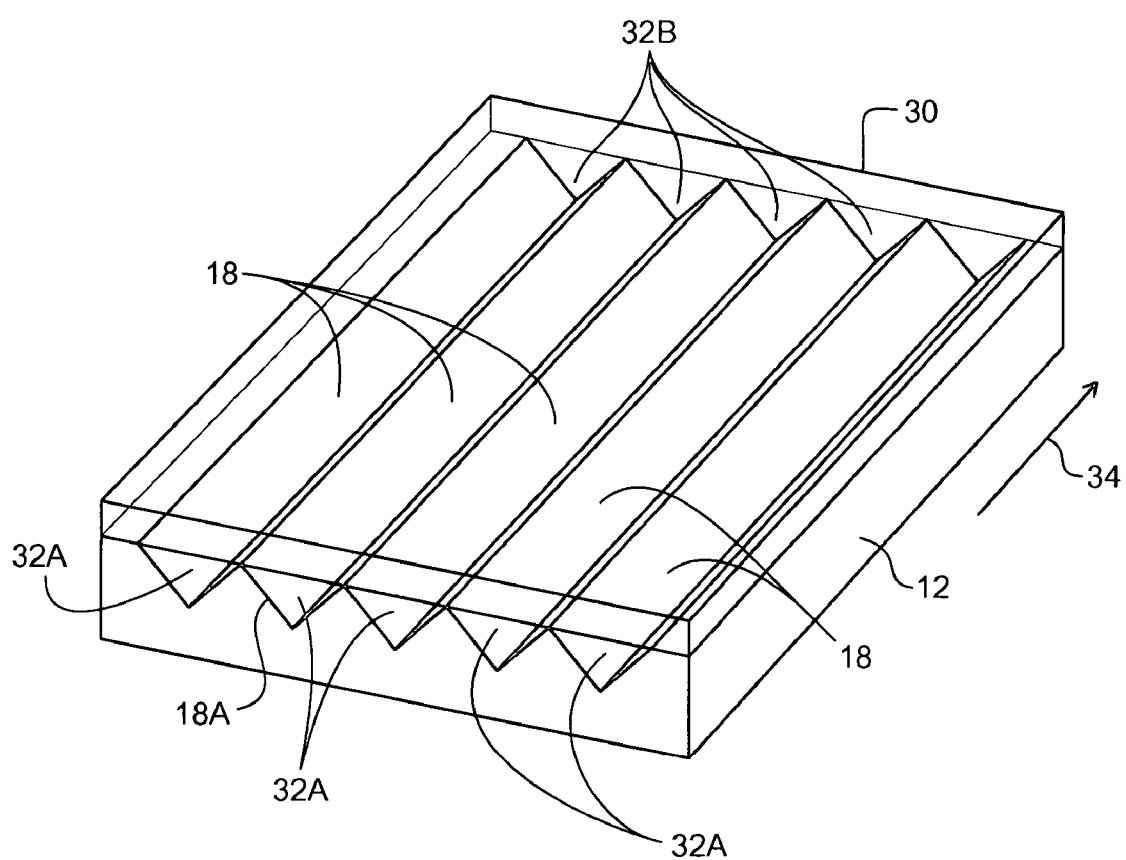
FIG. 4 shows a perspective view of the die of FIG. 3.

FIG. 4 shows a perspective view of die 12, to illustrate one exemplary embodiment of microchannels 18 formed between die 12 and plate 30 (shown transparently for purposes of illustration). A plurality of apertures 32A are thus formed at an input of die 12, to interface with input header 24A, and a plurality of apertures 32B are formed at an outlet of die 12, to interface with output header 24B. As discussed in connection with FIG. 9, apertures 32B may be larger than apertures 32A to facilitate preferential fluid flow along direction 34, corresponding to fluid flow directions 28A, 28B, FIG. 1.

Figure 5:
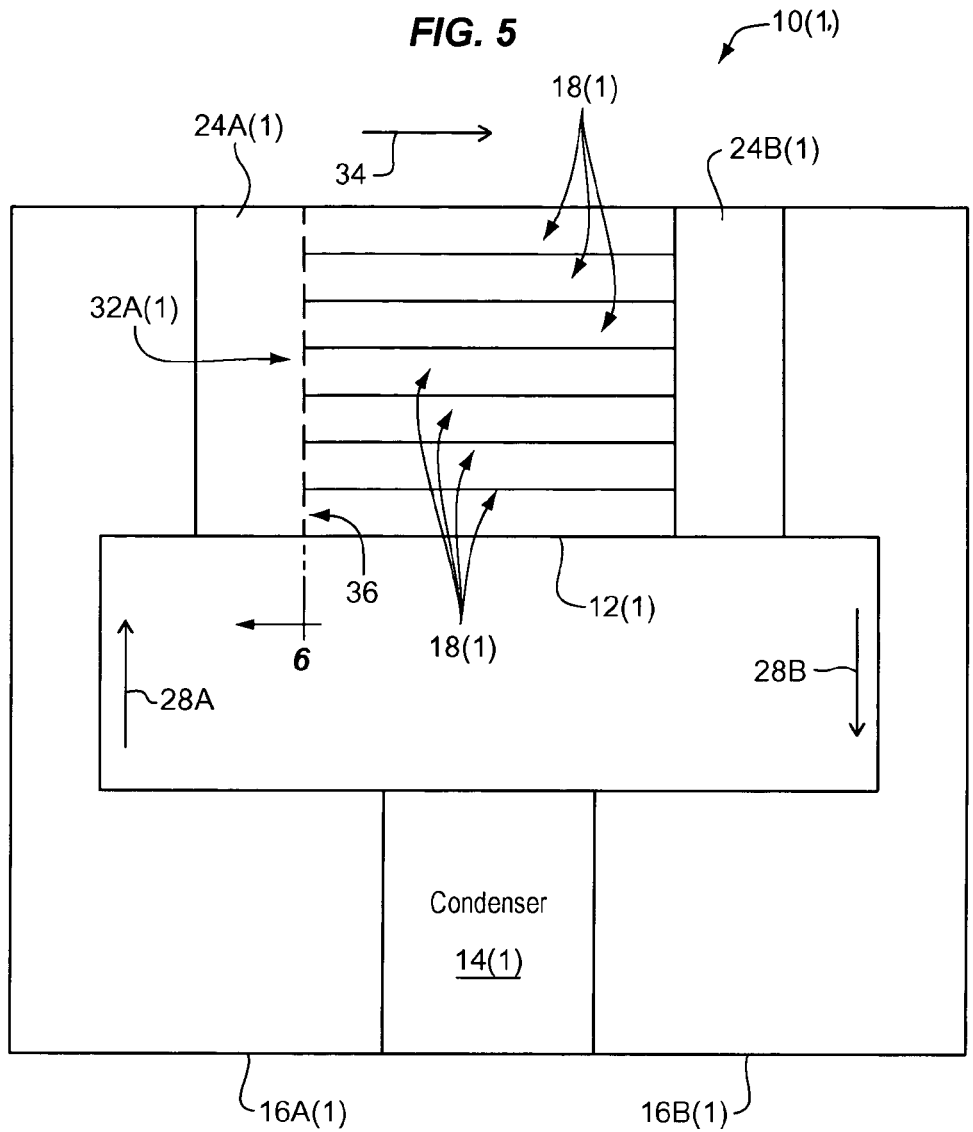
FIG. 5 shows a schematic view illustrating operation of one thermosyphon system with orifices within microchannels of the semiconductor die.
Figure 7:
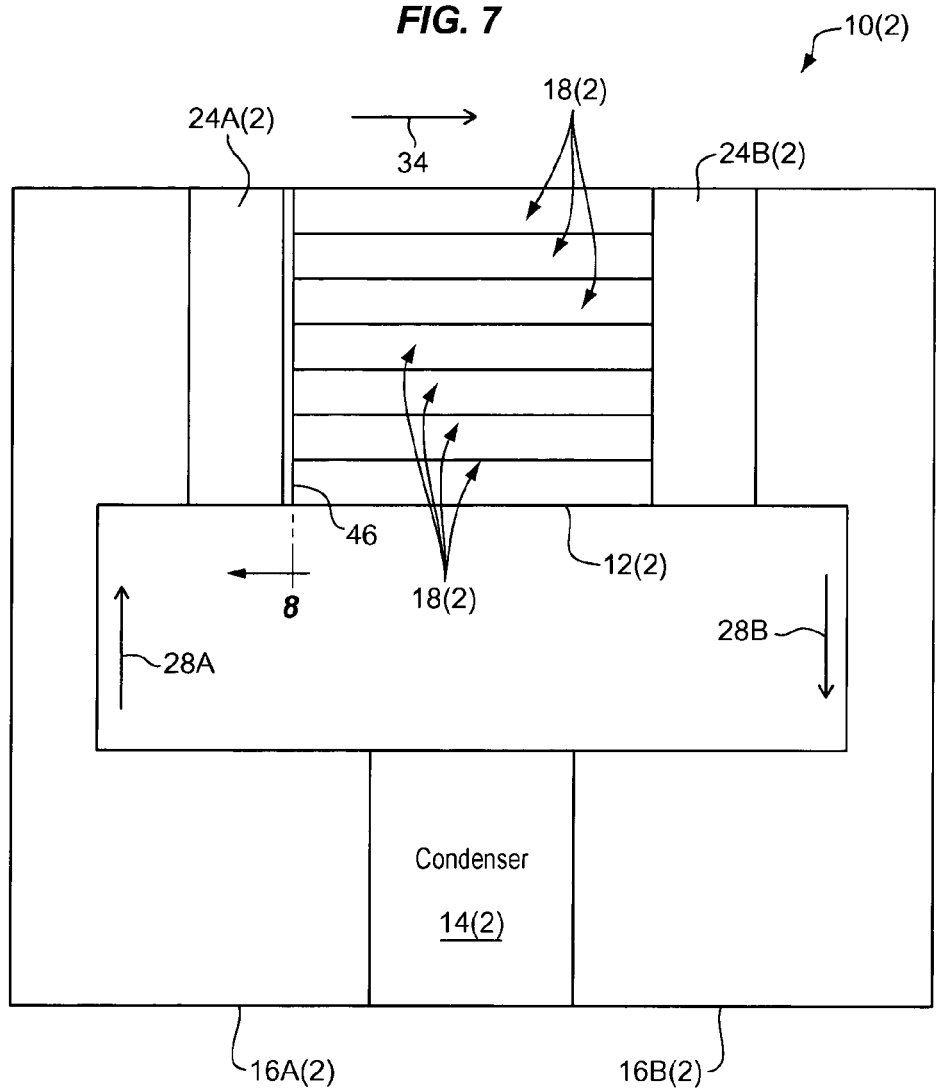
FIG. 7 shows a schematic view illustrating operation of one thermosyphon system with fluid-flow restrictive material within microchannels of the semiconductor die.
Figure 9:
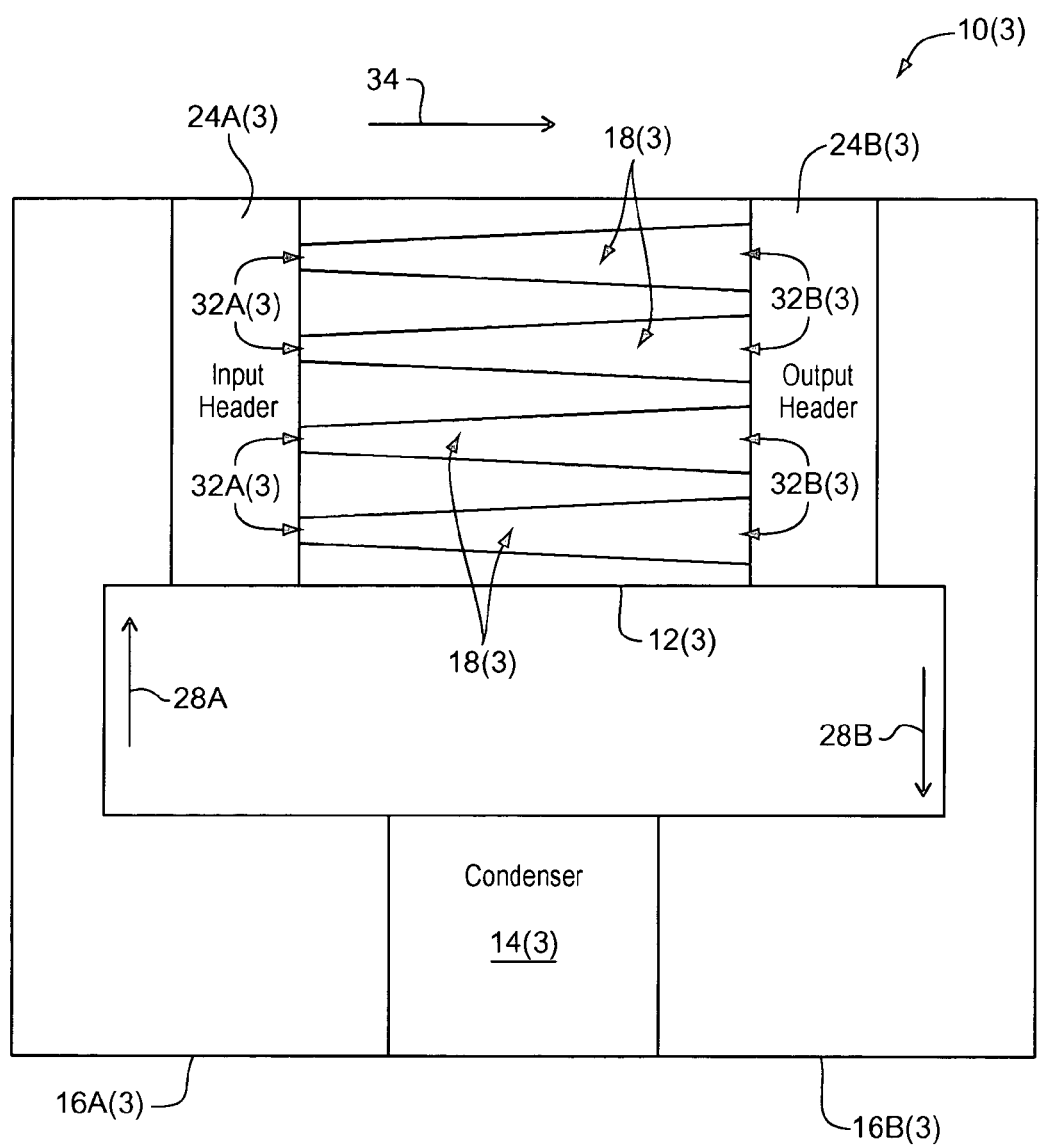
FIG. 9 shows a schematic view illustrating operation of one thermosyphon system with shaped microchannels of the semiconductor die.

FIG. 5 shows one loop thermosyphon system 10(1) in accord with one embodiment. FIG. 7 shows another loop thermosyphon system 10(2) in accord with another embodiment. FIG. 9 shows another loop thermosyphon system 10(3) in accord with another embodiment. In FIG. 5, FIG. 7 and FIG. 9, items numbered similarly to FIG. 1–4 provide like function.

Figure 6:
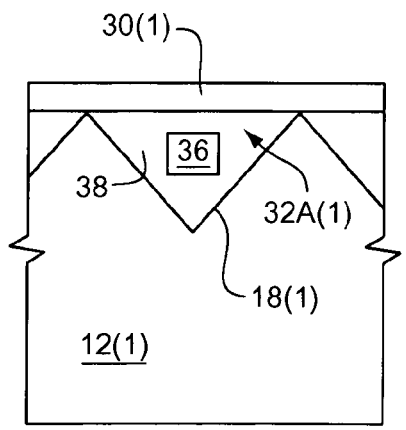
FIG. 6 shows a cross-sectional view of one microchannel with orifice.

In FIG. 5, for example, an orifice 36 (see FIG. 6) is disposed within one or more of microchannels 18(1) to provide preferential fluid flow through the die. In particular, die 12(1) of FIG. 5 has an orifice 36 disposed at an input (e.g., at input aperture 32A(1)) to each of its microchannels 18(1), to create the preferential fluid flow along direction 34. FIG. 6 illustrates an embodiment of orifice 36 within one aperture 32A(1). Though not required, input fluid conduit 16A(1) and/or input header 24A(1) may incorporate wicking structure, such as wicking structure 26, FIG. 1.

In particular, FIG. 6 shows a cross-sectional view of one microchannel 18(1), of die 12(1), and an exemplary rectangularly-shaped orifice 36 formed by a blocking material 38 (e.g., metal, plastic plating or like material) that prohibits fluid flow into microchannel 18(1) (other than through orifice 36). Orifice 36 may be formed in another shape as a matter of design choice. Microchannel 18(1) of FIG. 6 is illustratively shown as sealed by a plate 30(1) such that fluid flows through microchannels of die 12(1), through orifices 36, in closed-loop with fluid conduits 16A(1), 16B(1). Since there is no restriction or orifice at output header 24B(1), fluid within microchannels 18(1) preferentially flows along direction 34.

Figure 8:
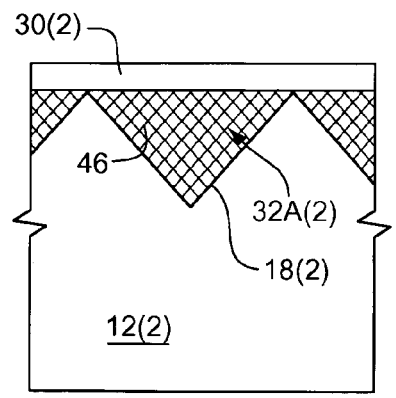
FIG. 8 shows a cross-sectional view of one microchannel with fluid-flow restrictive material.

Orifices 36 may be replaced by other fluid-flow restrictive material as shown in FIG. 7. In FIG. 7, fluid-flow restrictive material 46 (e.g., a metal screen, non-metal porous material, or metal porous material, such as sintered copper or metal matrix) is disposed within one or more of microchannels 18(2) to provide preferential fluid flow through the die. In particular, die 12(2) of FIG. 7 has material 46 disposed at an input (e.g., at input aperture 32A(2)) to each of its microchannels 18(2), to create the preferential fluid flow along direction 34. FIG. 8 illustrates an embodiment of restrictive material 46 within one input aperture 32A(2). Though not required, input fluid conduit 16A(2) and/or input header 24A(2) may incorporate wicking structure, such as wicking structure 26, FIG. 1.

In particular, FIG. 8 shows a cross-sectional view of one microchannel 18(2), of die 12(2), and fluid-flow restrictive material 46, in the form of a screen, that restricts fluid flow into microchannel 18(2). Microchannel 18(2) of FIG. 8 is illustratively shown as sealed by a plate 30(2) such that fluid flows through microchannels of die 12(2), through fluid-flow restrictive material 46, in closed-loop with fluid conduits 16A(2), 16B(2). Placement of fluid-flow restrictive material 46 at the input to microchannels 18(2) provides preferential flow along direction 34.

In FIG. 9, microchannels 18(3) are shaped or configured to provide preferential flow of fluid along direction 34, such as shown. Specifically, microchannels 18(3) may be etched such that apertures 32A(3), at input header 24A(3), are smaller than apertures 32B(3), at output header 24B(3), such that microchannel resistance to fluid flow lessens along direction 34. Accordingly, the cross-sectional area of microchannels 18(3) are smaller nearer to input header 24A(3), and larger nearer to output header 24B(3). Though not required, input fluid conduit 16A(3) and/or input header 24A(3) may incorporate wicking structure, such as wicking structure 26, FIG. 1.

Figure 10:
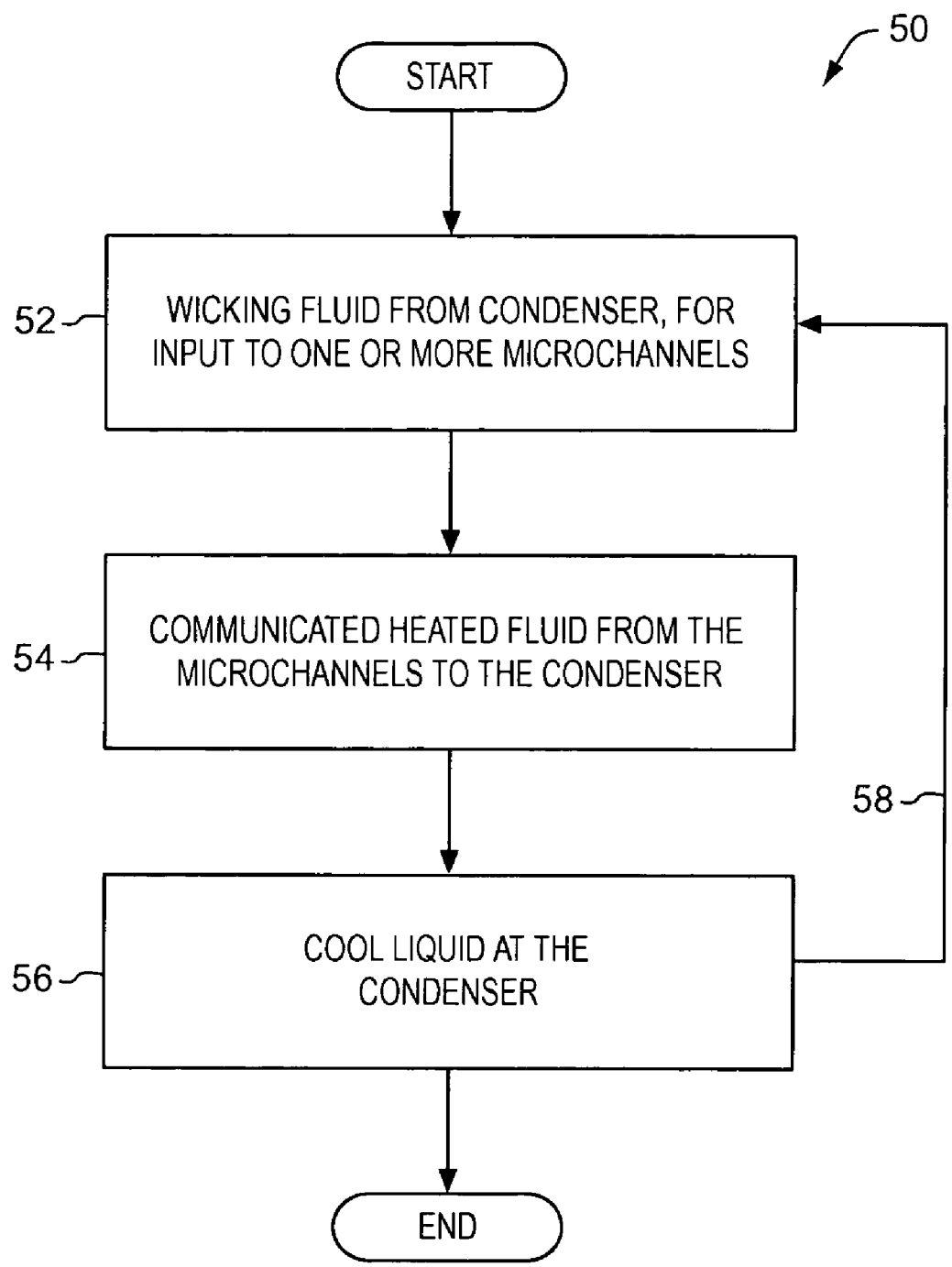
FIG. 10 shows one process for cooling a semiconductor die as evaporator within a loop thermosyphon system.

FIG. 10 shows one process 50 that cools a semiconductor die as evaporator within a loop thermosyphon system. In step 52, fluid is wicked from a condenser (e.g., condenser 14, FIG. 1), for input to one or more microchannels within a semiconductor die (e.g., die 12, FIG. 1). An example of step 52 is the utilization of wicking structure 26, FIG. 1, within an input fluid conduit (e.g., input fluid conduit 16A) coupling the condenser to the microchannels. Another example of step 52 is the utilization of wicking structure within an input header (e.g., input header 24A) between the input fluid conduit and the microchannels. In step 54, heated, fluid (or vapor or fluid-vapor mix) is communicated to the condenser. An example of step 54 is the utilization of an output fluid conduit 16B, coupling the heated fluid from the microchannels to the condenser. In step 56, liquid is cooled at the condenser. Steps 52, 54, 56 may repeat 58 as necessary to maintain cooling of the die. Process 50 may end when cooling of the die is no longer desired.

Certain changes may be made in the above methods and systems without departing from the scope hereof. It is thus intended that the above description and accompanying drawings be interpreted as illustrative and not limiting, and that he following claims cover generic and specific features of features described herein.

What is claimed is:

1. A loop thermosyphon system, comprising:
   a semiconductor die having a plurality of microchannels;
   a condenser in fluid communication with the microchannels; and
   wicking structure to wick fluid from the condenser to the semiconductor, the wicking structure being selected from the group comprising porous-like material, powder, fiber, screen and mixtures thereof;
   wherein the fluid dissipates heat away from the semiconductor die.

2. The system of claim 1, further comprising an input fluid conduit for coupling fluid from the condenser to the semiconductor die, the wicking structure being internal to the input fluid conduit.

3. The system of claim 1, further comprising an input header, coupled with the semiconductor die, and an input fluid conduit, coupled between the condenser and the input header, the input fluid conduit and input header cooperating to couple fluid from the condenser to the microchannels, the wicking structure being internal to one or both of the input fluid conduit and the input header.

4. The system of claim 1, further comprising a plate coupled with the die to seal the microchannels such that fluid flows through the microchannels.

5. The system of claim 1, further comprising fluid selected from the group consisting of water, Fluorinert and alcohol.

6. The system of claim 1, further comprising an output fluid conduit, for coupling fluid from the microchannels to the condenser.

7. The system of claim 1, further comprising an output header, coupled with the semiconductor die, and an output fluid conduit, coupled between the output header and the condenser, the output header and output fluid conduit cooperating to couple heated fluid from the microchannels to the condenser.

8. The system of claim 1, the wicking structure comprising thermally conductive material.

9. The system of claim 8, the wicking structure comprising copper.

10. The system of claim 1, the microchannels being shaped for preferential fluid flow along one direction of the microchannels.

11. The system of claim 1, further comprising blocking material forming at least one orifice at an input to at least one of the microchannels, for preferential fluid flow along one direction of the one microchannel.

12. The system of claim 11, the blocking material comprising one of metal and plastic.

13. The system of claim 1, the condenser being constructed and arranged above the die, wherein gravity forces cooler condenser fluid towards the die.

14. The system of claim 1, further comprising fluid-flow restrictive material at an input to at least one of the microchannels, for preferential fluid flow along one direction of the one microchannel.

15. The system of claim 14, the fluid-flow restrictive material comprising one of a screen, non-metal porous material, metal porous material, sintered copper and metal matrix.

16. A method of cooling a semiconductor die, comprising:
    wicking fluid from a condenser, for input to one or more microchannels of a semiconductor die, the step of wicking comprising utilizing wicking structure being selected from the group comprising porous-like material, powder, fiber, screen and mixtures thereof;
    communicating heated fluid from the die to the condenser; and
    cooling fluid at the condenser;
    wherein the fluid transfers heat away from the semiconductor die.

17. The method of claim 16, the step of wicking comprising utilizing an input fluid conduit, containing the wicking structure, between the condenser and the semiconductor die.

18. The method of claim 17, the step of wicking comprising utilizing an input header, containing the wicking structure, between the input fluid conduit and the microchannels.

19. The method of claim 16, further comprising the step of shaping the microchannels for preferential fluid flow along the microchannels.

20. The method of claim 16, further comprising the step of forming an orifice at an input to one or more of the microchannels, for preferential fluid flow along the one or more microchannels.

21. The method of claim 16, further comprising the step of placing fluid-flow restrictive material at an input to one or more of the microchannels, for preferential fluid flow along the one or more microchannels.

22. A loop thermosyphon system, comprising:
    a semiconductor die having a plurality of microchannels;
    fluid-flow restrictive material at an input to at least one of the microchannels, for preferential fluid flow along one direction of the at least one microchannel; and
    a condenser in fluid communication with the microchannels, to cool heated fluid from the die for input to the microchannels.

23. The system of claim 22, the fluid-flow restrictive material comprising one of a screen, non-metal porous material, metal porous material, metal matrix and sintered copper.

24. The method of claim 1, the wicking structure being selected from the group that further comprises microgrooves.

25. A method of cooling a semiconductor die, comprising:
wicking fluid from a condenser, for input to one or more microchannels of a semiconductor die;
placing fluid-flow restrictive material at an input to one or more of the microchannels, for preferential fluid flow along the one or more microchannels;
communicating heated fluid from the die to the condenser; and
cooling fluid at the condenser;
wherein the fluid transfers heat away from the semiconductor die.

26. The method of claim 25, the step of wicking comprising utilizing an input fluid conduit, containing the wicking structure, between the condenser and the semiconductor die.

27. The method of claim 26, the step of wicking comprising utilizing an input header, containing the wicking structure, between the input fluid conduit and the microchannels.

28. The method of claim 25, further comprising the step of shaping the microchannels for preferential fluid flow along the microchannels.

* * * * *